United States Patent
Fukutomi et al.

[11] Patent Number: 6,133,534
[45] Date of Patent: *Oct. 17, 2000

[54] WIRING BOARD FOR ELECTRICAL TESTS WITH BUMPS HAVING POLYMERIC COATING

[75] Inventors: Naoki Fukutomi, Yuki; Hidehiro Nakamura; Hajime Nakayama, both of Katsuta; Yoshiaki Tsubomatsu, Tsuchiura; Masanori Nakamura, Katsuta; Kouichi Kaitou, Ibaraki-ken; Atsushi Kuwano, Tsukuba; Itsuo Watanabe, Shimodate; Masahiko Itabashi, Mitsukaido, all of Japan

[73] Assignee: Hitachi Chemical Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/234,215

[22] Filed: Apr. 27, 1994

Related U.S. Application Data

[63] Continuation-in-part of application No. 07/983,342, Nov. 30, 1992, Pat. No. 5,426,850.

[30] Foreign Application Priority Data

Nov. 29, 1991 [JP] Japan ................................. 3-316252
Apr. 23, 1992 [JP] Japan ................................. 4-104675
Apr. 27, 1993 [JP] Japan ................................. 5-099954
Dec. 27, 1993 [JP] Japan ................................. 5-333201

[51] Int. Cl.[7] .................................................. H05K 1/09
[52] U.S. Cl. ......................... 174/257; 174/261; 174/260; 439/931
[58] Field of Search .............................. 174/260, 261, 174/257, 267; 361/768, 771, 779; 257/737, 738; 439/931, 886

[56] References Cited

U.S. PATENT DOCUMENTS

| | | | |
|---|---|---|---|
| 3,324,014 | 6/1967 | Modjeska | 29/848 X |
| 3,391,457 | 7/1968 | Reimann | 29/848 |
| 3,677,950 | 7/1972 | Carmelo | 252/79.5 |
| 3,912,852 | 10/1975 | Simon | 174/261 |
| 4,277,175 | 7/1981 | Karasaki et al. | |
| 4,306,925 | 12/1981 | Lebow et al. | 29/848 X |
| 4,374,869 | 2/1983 | Dorey, II et al. | 427/97 |
| 4,421,410 | 12/1983 | Karasaki et al. | |
| 4,606,787 | 8/1986 | Pelligrino | 156/150 X |
| 4,707,657 | 11/1987 | Bøegh-Petersen | |
| 4,764,804 | 8/1988 | Sahara et al. | 357/81 |
| 4,790,902 | 12/1988 | Wada et al. | 156/151 X |
| 4,893,404 | 1/1990 | Shrahata et al. | |
| 5,017,271 | 5/1991 | Whewell et al. | 204/15 |
| 5,028,492 | 7/1991 | Guenin | 428/614 |
| 5,114,878 | 5/1992 | Maruyama et al. | |
| 5,118,386 | 6/1992 | Kataoka et al. | 156/656 |
| 5,128,612 | 7/1992 | Aton et al. | |
| 5,192,835 | 3/1993 | Bull et al. | 174/260 |
| 5,258,577 | 11/1993 | Clements | 174/88 R |

(List continued on next page.)

FOREIGN PATENT DOCUMENTS

| | | |
|---|---|---|
| 0189975 | 8/1986 | European Pat. Off. |
| 0457501 | 11/1991 | European Pat. Off. |
| 0529577 | 3/1993 | European Pat. Off. |
| 0529578 | 3/1993 | European Pat. Off. |
| 02098139 | 4/1990 | Japan |

*Primary Examiner*—Jeffrey Gaffin
*Assistant Examiner*—Kamand Cuneo
*Attorney, Agent, or Firm*—Pennie & Edmonds LLP

[57] ABSTRACT

A wiring board for electrical tests; having an insulating substrate, wiring of predetermined pattern which is embedded in the insulating substrate, and bump electrodes which are formed on the wiring and which are respectively brought into contact with corresponding electrodes of an article to-be-tested. Thus, even when the electrode pitch of the article to-be-tested such as a semiconductor device has become smaller(for example, less than 0.1 [mm]), the electrodes can be formed so as to cope with the electrical tests of the article.

2 Claims, 4 Drawing Sheets

U.S. PATENT DOCUMENTS

| | | | |
|---|---|---|---|
| 5,260,518 | 11/1993 | Tanaka et al. | 174/261 |
| 5,272,376 | 12/1993 | Ueno | 257/737 |
| 5,279,711 | 1/1994 | Frankeny et al. | 174/263 |
| 5,350,323 | 9/1994 | Boissel et al. | 439/886 |
| 5,477,087 | 12/1995 | Kawakita et al. | 257/737 |
| 5,499,447 | 3/1996 | Murakami . | |
| 5,560,795 | 10/1996 | Bruckner et al. . | |
| 5,629,137 | 5/1997 | Leedy | 430/313 |
| 5,664,325 | 9/1997 | Fukutomi et al. . | |
| 5,839,190 | 11/1998 | Sullivan . | |

WIRING BOARD FOR ELECTRICAL TESTS WITH BUMPS HAVING POLYMERIC COATING

This application is a continuation-in-part of U.S. application Ser. No. 07/983,342, filed on Nov. 30, 1992, entitled "FABRICATION PROCESS OF WIRING BOARD", now U.S. Pat. No. 5,426,850 which is incorporated herein by reference.

BACKGROUND OF THE INVENTION

1. Field of the Invention

The present invention relates to a wiring board for electrical tests. By way of example, the electrical tests include the insulation and connection tests of high-density wiring in a printed-wiring circuit board, a circuit board for an integrated circuit or a circuit board for a liquid-crystal display, and the ON-resistance tests of a semiconductor device.

2. Description of the Related Art

As semiconductor devices have been subjected to increased density of integration and density of surface packaging, the tests of the devices and the packaging circuit boards thereof have become very difficult.

In the case of the semiconductor devices, several tens ~ several hundred of electrodes are laid out on silicon chips of several millimeters square. Further, a semiconductor device having more than one thousand electrodes will be developed. The tests of such devices are extremely difficult. Especially, it is difficult to test a so-called "bare chip" which is a silicon chip before being packaged (namely, before being mounted on a lead frame and encapsulated with a resin). Granted that although testing of the bare chips is possible, it is not commonly undertaken because of complicated test jigs and heavy test expenses.

On the other hand, also in the case of the wiring circuit boards for use in the packaging, the microfabrication of wiring has been promoted. It has been required of the wiring circuit boards to have wiring leads at a pitch of or below 0.1 [mm] and electrodes at a pitch of or below 0.1 [mm] (equal to the electrode pitch of the semiconductor devices). Such wiring circuit boards cannot be tested with regard to insulation and connection by a conventional method which permits the electrodes to be temporarily connected and disconnected. An example of such a method is that in which anisotropic conductive rubber is brought into pressed touch with the electrodes as disclosed in the official gazette of Japanese Patent Application Laid-open No. 3269/1984.

SUMMARY OF THE INVENTION

In view of the circumstances stated above, the present invention has for its object to provide a wiring board for electrical tests which facilitates the tests of a semiconductor device, a wiring circuit board or the like (hereinbelow, sometimes termed an "article to-be-tested").

Another object of the present invention is to provide a method of manufacture which is well suited to the aforementioned wiring board for electrical tests.

A wiring board for electrical tests according to the present invention comprises an insulating substrate, wiring of predetermined pattern which is embedded in the insulating substrate, and bump electrodes which are formed on the wiring and which are respectively brought into contact with corresponding electrodes of an article to-be-tested such as a semiconductor device or a wiring circuit board for packaging use. Herein, the wiring of predetermined pattern serves as lead-out lines which connect the respectively corresponding bump electrodes to measuring instruments arranged outside the wiring board.

The wiring board for electrical tests is manufactured by methods according to the present invention as exemplified below.

One example of the manufacturing method comprises the step of forming wiring of predetermined pattern on a temporary substrate which is electrically conductive and in which a thin nickel layer (0.1~10 [$\mu$m] thick) is formed on an elongate copper foil (20~100 [$\mu$m] thick), the step of embedding the wiring in an insulating substrate, and the step of removing a part of the conductive temporary substrate except the other parts thereof which become bump electrodes that are respectively brought into contact with electrodes of an article to-be-tested. Further, if necessary, this example comprises the step of covering the wiring of predetermined pattern with an insulating layer (a surface passivation layer) so as not to entirely conceal the bump electrodes.

In the above method, the step of partly removing the conductive temporary substrate proceeds as follows:

An etching resist of predetermined pattern is formed on those parts of the surface of the copper foil of the temporary substrate which become the bump electrodes. Thereafter, the copper foil is etched with an etchant. Since the etching of the copper foil ends in the thin nickel layer, the wiring of predetermined pattern (made of copper) is not etched. Subsequently, the etching resist is peeled off, and the exposed or denuded part of the thin nickel layer is etched and removed with another etchant.

The formation of the bump electrodes at a high density and at a high accuracy is permitted using that copper foil of the temporary substrate which is as thin as about 20~30 [$\mu$m]. When the copper foil is thicker, the amount of side etching or lateral etching enlarges in etching the copper foil in order to form the bump electrodes, making it impossible to form the high-density and high-accuracy bump electrodes. In the case where the thin copper foil is employed, the bump electrodes as desired can be formed by a method stated below. A plating resist of predetermined pattern is formed on the surface of the thin copper foil. Subsequently, those parts of the foil surface which correspond to the bump electrodes to-be-formed are plated so as to partly increase the thickness of the copper foil. After the plating resist is peeled off, an etching resist is formed on those plated parts of the foil surface which become the bump electrodes, and the thin copper foil is etched and removed with an etchant under this condition. Further, the exposed part of the thin nickel layer is etched and removed with another etchant.

Meanwhile, another example of the manufacturing method according to the present invention consists in comprising the step of forming wiring of predetermined pattern on a temporary substrate, the step of embedding the wiring in an insulating substrate, the step of removing the temporary substrate without damaging the wiring of predetermined pattern formed thereon, the step of depositing an insulating material capable of photo-imaging on one side of the insulating substrate including the wiring by either coating or lamination techniques, and then subjecting the deposited insulating material to exposure as well as development, thereby forming an insulating layer (a surface passivation layer) which serves as a plating resist, on a part of the one side of the insulating substrate except the other parts thereof which correspond to bump electrodes to-be-formed that are respectively brought into contact with electrodes of an article to-be-tested, and the step of forming the bump electrodes by plating.

In the above method, the step of removing the temporary substrate can be so performed that, after a copper foil constituting the temporary substrate is etched and removed with a copper etchant, a thin nickel layer constituting the temporary substrate is etched and removed with a nickel etchant. In addition, the step of forming a photo-image on the insulating layer can be performed using an excimer laser. The bump electrodes should preferably be formed by performing the plating in excess of the thickness of the photo-imaging material.

Mentioned as an example of the photo-imaging material is a composite which is a photosensitive resist for electroless plating, and which consists of rubber—phenol resin—epoxy resin, an epoxy resin photoinitiator (such as aromatic onium salt) and an aromatic polyazide compound (such as 3,3'-diazidodiphenylsulfone, 4,4'-diazidostilbene, 4,4'-diazidochalcone, and 3,3'-dimethoxy-4,4'-diazidobiphenyl).

In the foregoing, there has been described the case where the copper foil and the thin nickel layer of the temporary substrate are removed by etching. It is also allowed, however, to adopt an expedient in which, after the etching and removal of the copper foil, the insulating material capable of photo-imaging is deposited by either coating or lamination techniques and is subjected to exposure as well as development, thereby forming the layer of a plating resist, whereupon the bump electrodes are formed by plating (electroplating). In this expedient, electric power for the electroplating can be fed through the thin nickel layer. After the formation of the bump electrodes, the thin nickel layer is etched and removed.

BRIEF DESCRIPTION OF THE DRAWINGS

FIG. 1 is a sectional view of a wiring board for tests in an embodiment of the present invention (taken along line I–I' in: FIG. 2), while FIG. 2 is a plan view of the wiring board for tests.

PREFERRED EMBODIMENTS OF THE INVENTION

Figure 1:
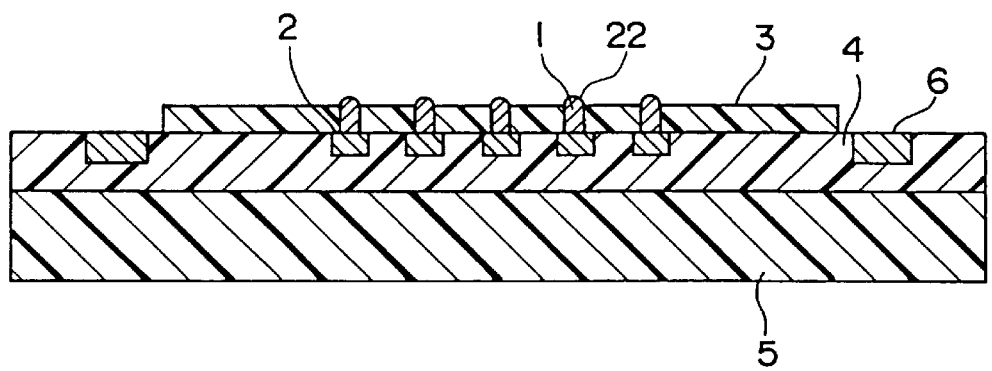
Figure 2:
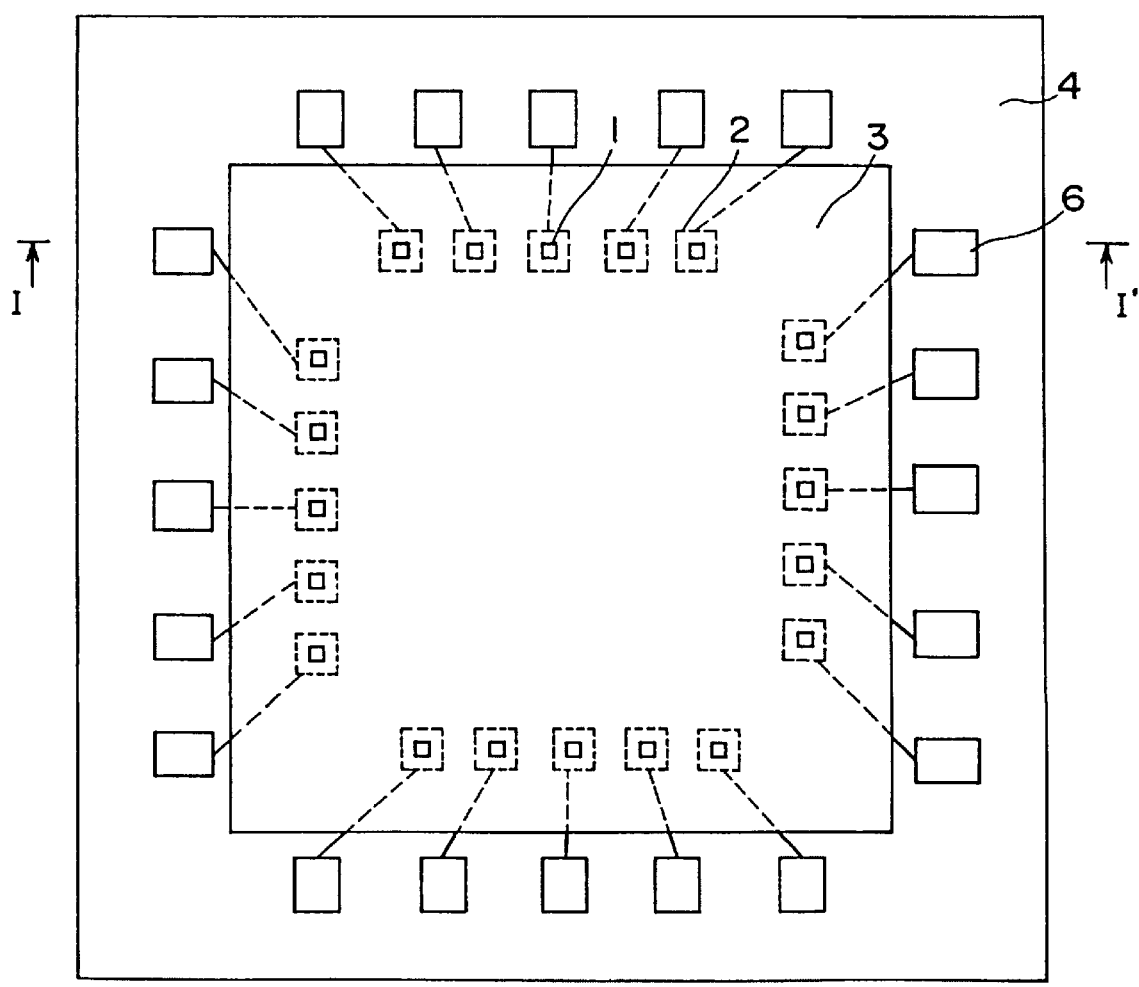

FIG. 1 is a sectional view showing a wiring board for electrical tests in an embodiment of the present invention, while FIG. 2 is a plan view showing the wiring board for electrical tests. The sectional view of FIG. 1 is taken along line I–I' and viewed in the direction of arrows as indicated in FIG. 2.

Referring to FIGS. 1 and 2, the wiring board in this embodiment comprises bump electrodes 1 which are respectively brought into contact with the corresponding electrodes of an article to-be-tested such as a semiconductor device, and wiring of predetermined pattern 2 which serves as lead-out lines for the bump electrodes 1. It also comprises a surface passivation layer 3, a resin layer 4, and a transparent substrate 5 which serves as an insulating substrate "transparent" means transparent to visible light. Further, external connection terminals 6 are formed in order to connect the lead-out lines 2 with measuring instruments which are arranged outside the wiring board. Incidentally, the wiring of predetermined pattern 2, the bump electrodes 1, etc. are exaggeratedly depicted in FIGS. 1 and 2.

The present invention consists in the wiring board for electrical tests in which the bump electrodes (1 in this embodiment) are formed in correspondence with the electrode layout of the article to-be-tested and are led out by the leads (2). According to the wiring board for electrical tests in the present invention, even when the electrode pitch of the device or the like has become smaller, the electrodes (1) can be satisfactorily formed. In addition, even when electrodes to-be-tested are laid out, not only along the four lateral sides of the device or the like, but also at the inner or deep parts thereof, the electrodes (1) can be led out by the fine or micro wiring leads (2). More specifically, when the electrode pitch is on the order of 0.1 [mm], the width of the wiring lead which passes through the pitch is required to be 0.03 [mm] or less. In this regard, a wiring transfer process according to the present invention can form the lead-out lines (the wiring of predetermined pattern 2) so as to meet the requirement.

Since the surface of the wiring of predetermined pattern (2) is flattened by the wiring transfer process according to the present invention, the bump electrodes (1) can be formed with ease by either of an etching process and a plating process. More specifically, in the case of the etching process, the bump electrodes (1) can be easily formed in such a way that a temporary substrate which can be processed by etching is prepared, and that it is etched and processed into a required pattern. On the other hand, in the case of the plating process, any desired pattern for the bump electrodes (1) can be formed in such a way that the required pattern is imaged with a photoresist or the like, and that plating is thereafter performed.

Also, the wiring transfer process according to the present invention makes it possible to select a substrate (such as the transparent substrate 5) at will. By way of example, when a transparent glass substrate or a resin layer is selected, a wiring board the wiring pattern of which is visible from the rear surface thereof is obtained. Owing to such a wiring board, the positioning of the wiring board with the article to-be-tested becomes very easy.

With the wiring board for electrical tests according to the present invention, it is also possible to equalize the lengths of those lead-out lines of the bump electrodes (1) which are the wiring of predetermined pattern (2), or to design the lead-out lines of the bump electrodes (1) as transmission lines.

Further, according to the present invention, each of the distal ends of the bump electrodes (1) opposite to the base ends thereof which are continuous to the wiring of predetermined pattern (2) is formed with a layer of conductive polymer. This contrivance is effective to prevent the electrodes and wiring of the article to-be-tested from damaging.

There will now be described methods of covering the distal ends of the bump electrodes (1) made of a conductive metal, with the conductive polymer without drastically lowering the conductivity of the metal.

1. Methods in which the distal ends of the electrodes (1) are selectively or locally covered with a conductive polymer or with a mixture consisting of the conductive polymer and another resin (or other resins):

(1) A conductive polymer (undoped), for example, polythiophene, polypyrrole, polyacetylene or polyphenylenevinylene, or a mixture comprising the conductive polymer (undoped) and another resin (such as elastomer), for example, rubber, poly(vinyl chloride), poly(vinyl acetate), a phenol resin or an epoxy resin, is dissolved in a suitable solvent. The bump electrodes are immersed in the resulting solution, and the solvent of the solution is volatilized. Thus, the distal ends of the bump electrodes are covered with the conductive polymer. Thereafter, the conductive polymer is doped with several kinds of dopants, for example, ferric chloride, iodine, titanium chloride and phosphorus pentafluaride.

(2) The bump electrodes are immersed in a mixed solution comprising the monomer of a conductive polymer and dopants, and the conductive polymer is produced by electrolytic polymerization in this state.

(3) The bump electrodes are covered with a resin (such as elastomer), for example, rubber, polyvinyl chloride, polyvinyl acetate, a phenol resin or an epoxy resin, and they are immersed in a mixed solution comprising the monomer of a conductive polymer and dopants. While being produced by electrolytic polymerization in the immersion state, the conductive polymer is caused to permeate the layer of the covering resin. Thus, each of the distal ends of the bump electrodes is formed with a composite conductive polymer film.

(4) The bump electrodes are covered with a film of polymer anions or with a film of a mixture comprising the polymer anions and a resin (such as elastomer), for example, rubber, polyvinyl chloride, polyvinyl acetate, a phenol resin or an epoxy resin, and they are immersed in a solution of the monomer of a conductive polymer. While being produced by electrolytic polymerization in the immersion state, the conductive polymer is caused to permeate the covering film. Thus, each of the distal ends of the bump electrodes is formed with a composite conductive polymer film.

(5) The bump electrodes are covered with a resin (such as elastomer) which is, for example, rubber, polyvinyl chloride, polyvinyl acetate, a phenol resin or an epoxy resin and in which an oxidizer is mixed. Such electrodes are exposed to the vapor of the monomer of a conductive polymer. While being produced by polymerization in this state, the conductive polymer is caused to permeate the layer of the covering resin. Thus, each of the distal ends of the bump electrodes is formed with a composite conductive polymer film.

2. Methods in which the distal ends of the electrodes (1) are selectively covered with a conductive polymer in such a way that a conductive polymer film or a composite conductive polymer film is used as an etching resist for etching a temporary substrate:

(1) A conductive polymer (undoped), for example, polyethiophene or the conductive polymer in which radicals having photopolymerizable ethylenic linkages are introduced, or a mixture comprising the conductive polymer (undoped) and another resin (such as elastomer), is dissolved in a suitable solvent. After a temporary substrate is formed with the film of the resulting solution, it is irradiated with ultraviolet radiation through a pattern mask and is subjected to development. Thus, a conductive polymer film formed with the pattern of an etching resist is obtained. Thereafter, the conductive polymer film is doped with several kinds of dopants. Further, the temporary substrate is etched using the doped conductive polymer film as the etching resist. Then, the bump electrodes covered with the conductive polymer are formed.

(2) A resin capable of photo-cross-linking is mixed into the conductive polymer (undoped) mentioned in the preceding method 2. (1). Thenceforth, the bump electrodes covered with the conductive polymer are formed by the method 2. (1). The resin capable of photo-cross-linking is, for example, a composite which consists of the cocondensate between alkyl (meta)acrylate and (meta)acrylic acid, tetraethylene glycol and benzophenone (photoinitiator), or a composite which consists of a phenol resin and orthonaphthoquinone diazido.

(3) A film is formed of a conductive polymer (undoped) or of a mixture comprising the conductive polymer (undoped) and another resin on a temporary substrate, and is doped with dopants. The film is coated with a photosensitive resist so as to form a resist film of predetermined pattern. Subsequently, using the resist pattern as a mask, the subbing or underlying conductive polymer film is etched to transfer the pattern. Further, the temporary substrate is etched using the resulting conductive polymer film as an etching resist film, and the photosensitive resist is removed. Then, the bump electrodes covered with the conductive polymer are formed.

(4) A conductive polymer (undoped) or a mixture comprising the conductive polymer (undoped) and another resin is dissolved in a suitable solvent, along with a compound adapted to generate dopants by light, for example, triphenyliodonium tetrafluoroborate. After a temporary substrate is formed with a film of the resulting solution, it is irradiated with ultraviolet radiation through a pattern mask so as to dope only its irradiated parts with the dopants and to render them insoluble. Subsequently, the resulting substrate is subjected to development. Thus, the conductive polymer is patterned. Thenceforth, an electrode pattern covered with the conductive polymer is formed by the method 2. (1).

Referring now to FIGS. 3 thru 12, an embodiment of the present invention will be described as to a case where a conductive polymer layer is formed after the formation of bump electrodes. The figures are sectional views for explaining the steps of a manufacturing method in this case.

Figure 3:
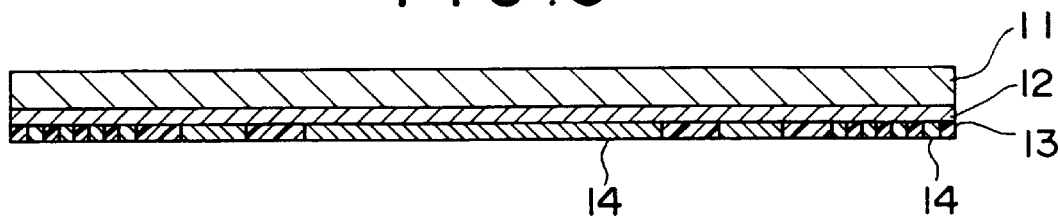
FIGS. 3 thru 12 are sectional views showing the steps of a method of manufacturing a wiring board for tests in an embodiment of the present invention.
Figure 4:
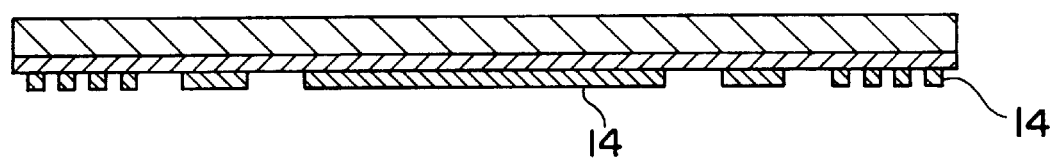

This embodiment employs a double-layer foil which consists of an electrolytic copper foil 11 having a thickness of 35~70 [$\mu$m] and a nickel layer 12 having a thickness of 0.1~0.5 [$\mu$m]. A resist 13 is deposited on the surface of the nickel layer 12 in laminated fashion. The resist 13 is, for example, "HN350" (trade name) produced by Hitachi Chemical Co., Ltd. in Japan. Thereafter, a negative image including a predetermined pattern is printed on the resist layer 13 by exposure at an integral exposure value of 125~130 [mJ/cm$^2$] and development. Using the layers 11 and 12 as an electrode, the positive image of the pattern is formed by copper electroplating (FIG. 3). After the resist 13 is peeled off, the positive image of the pattern becomes as indicated at numeral 14 (FIG. 4).

Figure 5:
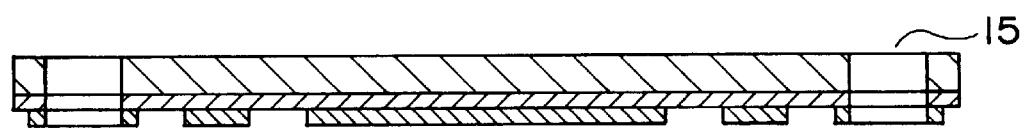

Thereafter, holes 15 each having a diameter of 5 [mm] are formed by punching (FIG. 5).

Figure 6:
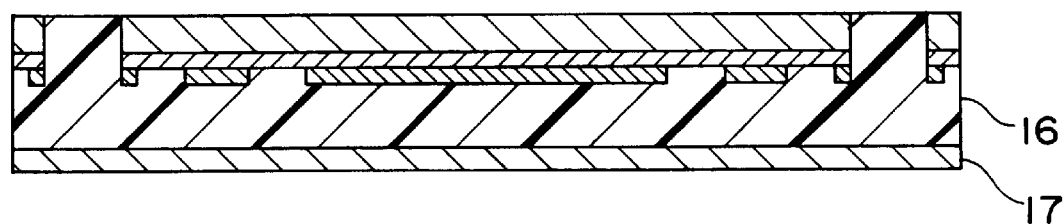
Figure 7:
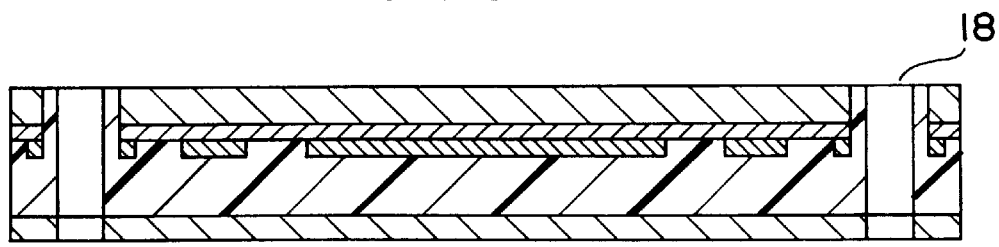

The copper electroplating pattern 14 of the foil formed as shown in FIG. 5 is embedded in any desired resin (the wiring transfer process). On this occasion, in order to eliminate foreign matters and oil and fat contents remaining among pattern parts, the structure shown in FIG. 5 is immersed for cleaning in "Neosundep" (trade name) produced by Nihon Marusel Co. The preparing treatment of the surface of the pattern parts is completed. In order to ensure a peeling strength, a roughened surface is formed by oxidizing the pattern copper and then reducing the copper oxide. Subsequently, the resulting structure is pressed in a vacuum within 24 [hours] along with an electrolytic copper foil 17 having a thickness of 35 [$\mu$m] and serving to prevent any warp in the course of the manufacturing method, through a thermosetting glass epoxy prepreg 16 (FIG. 6). Thereafter, guide holes (first guide holes) 18 each having a diameter of 3.15 [mm] are formed by drilling (FIG. 7).

Figure 8:
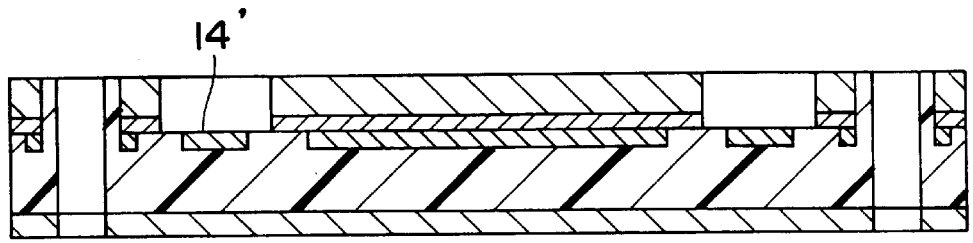
Figure 9:
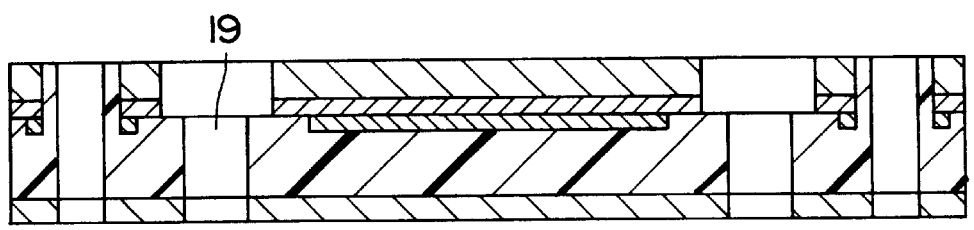

In order to etch the carrier 11 at a high positional accuracy, guide marks each having a diameter of 4 [mm] and indicated at numeral 14' in FIG. 8 are made visible from the carrier side. The surface of the carrier 11 is buffed and flattened in order to eliminate layers having adhered to the carrier side due to the oxidizing and reducing treatments of the metals at the step of FIG. 6. Thereafter, a resist is applied in laminated fashion, and circular patterns which extend along the guide marks 14' are printed as a negative image. After exposure and development, the copper layer 11 is etched by alkali etching. On this occasion, the nickel layer 12 is not etched. Therefore, it prevents the embedded copper pattern 14 from being etched. Subsequently, the exposed parts of the nickel layer 12 are removed with nickel etching "Solution-A" and "Solution-B" produced by Meltex Co. and hydrogen peroxide. After the resist is peeled off (FIG. 8), holes 19 are provided by an NC (numerical control) technique with reference to the pattern of the visible guide marks 14'. The holes 19 are used as the second guide marks for the next mask alignment (FIG. 9).

Figure 10:
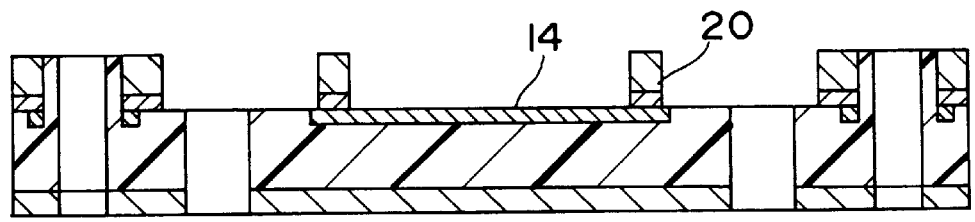
Figure 11:
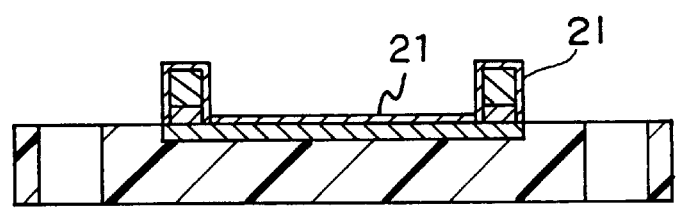

The surface of the resulting structure is flattened by buffing in order to ensure the close adhesion of a resist. After the resist is deposited in lamination fashion, a negative image is printed using the second guide holes 19 as alignment marks, and it is exposed to light and developed. Subsequently, copper etching, nickel etching and resist peeling are carried out in the same manner as in FIG. 8. When the thickness of the copper of the carrier 11 is controlled, bump electrodes 20 each of which has a desired section of slight side etching are formed (FIG. 10). The bump electrodes 20 and the transferred wiring pattern 14 are plated with nickel and gold. The resulting plating layer 21 should desirably consist of a nickel layer being 2~6 [$\mu$m] thick and a gold plating layer being 0.1~7 [$\mu$m] thick. When the resulting structure is externally machined or cut, a board which includes lead-out wiring leads and external terminals as predetermined (the wiring pattern) and the bump electrodes formed on the wiring leads is obtained (FIG. 11).

Figure 12:
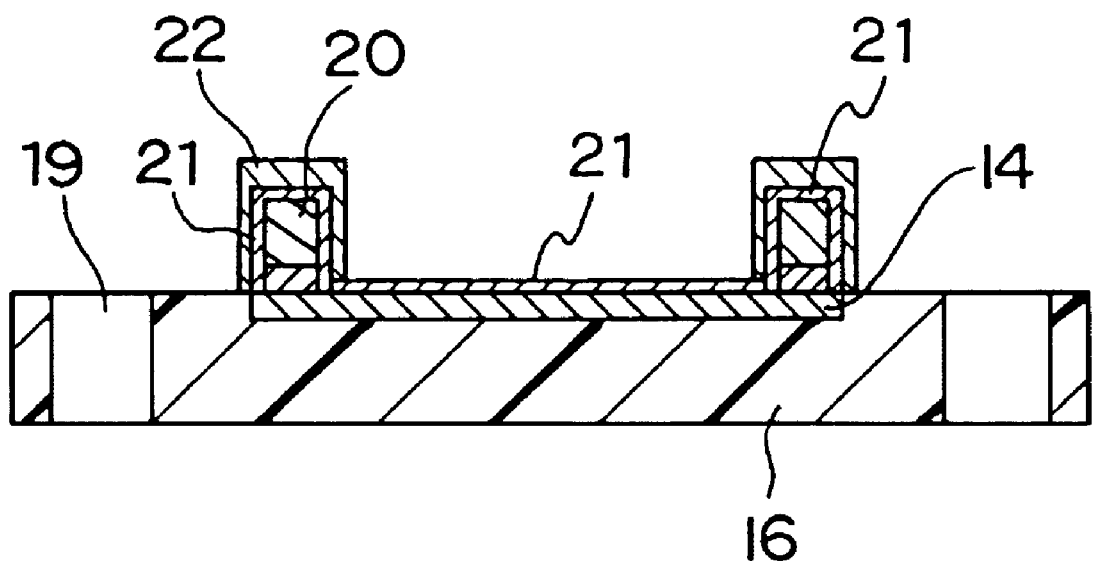

The obtained board is fixed to a small-sized press with the bump electrodes 20 facing down. Also, a floating glass member, an acrylic plate or the like which is formed with a film of conductive resin at a thickness of 1~30 [$\mu$m] by an applicator or a spin-coating machine is set underneath the board attached to the press. In this state, the conductive resin 22 can be selectively deposited on the bump electrodes 20 by the descending operation of the press. Thus, the testing board of the present invention having a structure as shown in FIG. 12 results.

The wiring board for tests according to the present invention easily copes with the narrow pitch of the pattern of an article to-be-tested. Moreover, the bump electrodes made of the conductive metal have only their distal ends covered with the elastic resin without spoiling the electric conductivity of the metal. Therefore, the surface electrodes of the article to-be-tested are not damaged, the surfaces of the testing board and the article to-be-tested can be brought into reliable and uniform touch, and the lifetime of the bump electrodes of the testing wiring board itself is prolonged.

What is claimed is:

1. A test wiring board comprising:

an insulating wiring substrate having a first side and a second side;

wiring of a predetermined pattern which is embedded in the first side of said insulating substrate;

bump electrodes formed from metal which are formed on said wiring, wherein at least some of said bump electrodes have free distal ends thereof covered with conductive polymer, said conductive polymer being made of a material detachable and attachable to electrodes being tested, wherein said conductive polymer comprises a polymer having molecules which have conductivity; and a transparent substrate attached to said second side.

2. The test wiring board of claim 2, wherein the transparent substrate is insulating.

* * * * *